United States Patent
Klebanov et al.

(10) Patent No.: US 11,195,826 B2
(45) Date of Patent: Dec. 7, 2021

(54) ELECTROSTATIC DISCHARGE PROTECTION

(71) Applicant: Allegro MicroSystems, LLC, Manchester, NH (US)

(72) Inventors: Maxim Klebanov, Palm Coast, FL (US); Washington Lamar, Mont Vernon, NH (US); Sagar Saxena, Manchester, NH (US); Chung C. Kuo, Manchester, NH (US); Sebastian Courtney, Dracut, MA (US); Sundar Chetlur, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 169 days.

(21) Appl. No.: 16/776,680

(22) Filed: Jan. 30, 2020

(65) Prior Publication Data

US 2021/0242193 A1 Aug. 5, 2021

(51) Int. Cl.
*H01L 27/02* (2006.01)
*H02H 9/04* (2006.01)
*H01L 29/866* (2006.01)

(52) U.S. Cl.
CPC ........ *H01L 27/0259* (2013.01); *H01L 29/866* (2013.01); *H02H 9/046* (2013.01)

(58) Field of Classification Search
CPC ....... H01L 2027/11855; H01L 27/0925; H01L 27/0927; H01L 21/823493; H01L 23/60–62; H01L 27/0248–0296
See application file for complete search history.

(56) References Cited

U.S. PATENT DOCUMENTS

| | | | |
|---|---|---|---|
| 9,318,481 B1 | 4/2016 | Wang et al. |
| 9,368,486 B2 | 6/2016 | Wang et al. |
| 9,929,141 B2 | 3/2018 | Kuo et al. |
| 10,256,225 B2 | 4/2019 | Klebanov et al. |
| 10,468,485 B2 | 11/2019 | Chetlur et al. |
| 2019/0305547 A1 | 10/2019 | Tran |
| 2019/0363162 A1 | 11/2019 | Chetlur et al. |
| 2020/0076189 A1 | 3/2020 | Lamar et al. |

*Primary Examiner* — Amar Movva
(74) *Attorney, Agent, or Firm* — Daly, Crowley, Mofford & Durkee, LLP

(57) ABSTRACT

In one aspect an electronic device includes a substrate having one of a p-type doping or an n-type doping, a first well in the substrate, a second well in the substrate, a third well in the substrate between the first and second wells, a first terminal connected to the first well, a second terminal connected to the second well, an electrostatic discharge (ESD) clamp connected to the first and second terminals and a transient voltage source connected to the third well. A doping type of the first, second and third wells is the other one of the p-type or n-type doping. The ESD clamp is configured to clamp the first and second wells at a clamp voltage during an ESD event and the transient voltage source is configured to provide a voltage during the ESD event that is less than the clamp voltage.

20 Claims, 9 Drawing Sheets

ELECTROSTATIC DISCHARGE PROTECTION

BACKGROUND

Bipolar-CMOS-DMOS (BCD) technology integrates bipolar transistors with complementary metal oxide semiconductor (CMOS) logic and double diffused metal-oxide-semiconductor (DMOS) transistors. High Voltage BCD technologies (e.g., with operating voltages in excess of 100V), are prone to a circuit failure due to turn-on of a parasitic transistor between wells during an electrostatic discharge event (ESD) event. Power clamps are circuits that can be used to protect other circuitry from damage due to overvoltage conditions caused by, for example, ESD and other noise events.

SUMMARY

In one aspect, an electronic device includes a substrate having one of a p-type doping or an n-type doping, a first well in the substrate, a second well in the substrate and a third well in the substrate between the first well and the second well. The electronic device also includes a first terminal connected to the first well, a second terminal connected to the second well, an electrostatic discharge (ESD) clamp connected to the first and second terminals, and a transient voltage source connected to the third well. The first, second and third wells are separated from each other. A doping type of the first, second and third wells is the other one of the p-type or n-type doping. The ESD clamp is configured to clamp the first well and the second well at a clamp voltage during an ESD event, and the transient voltage source is configured to provide a voltage during the ESD event that is less than the clamp voltage.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to provide electrostatic discharge (ESD) protection. In one particular example, the techniques described herein provide ESD protection in electronic devices that include BCD technology. In one example, a well is provided in a substrate and is doped opposite to the substrate, and the well is connected to a transient voltage source that, during an ESD transient, provides an alternative transistor that prevents circuit failure. The techniques described herein reduce overheating, silicon filamentation and associated device failure.

Figure 1A:
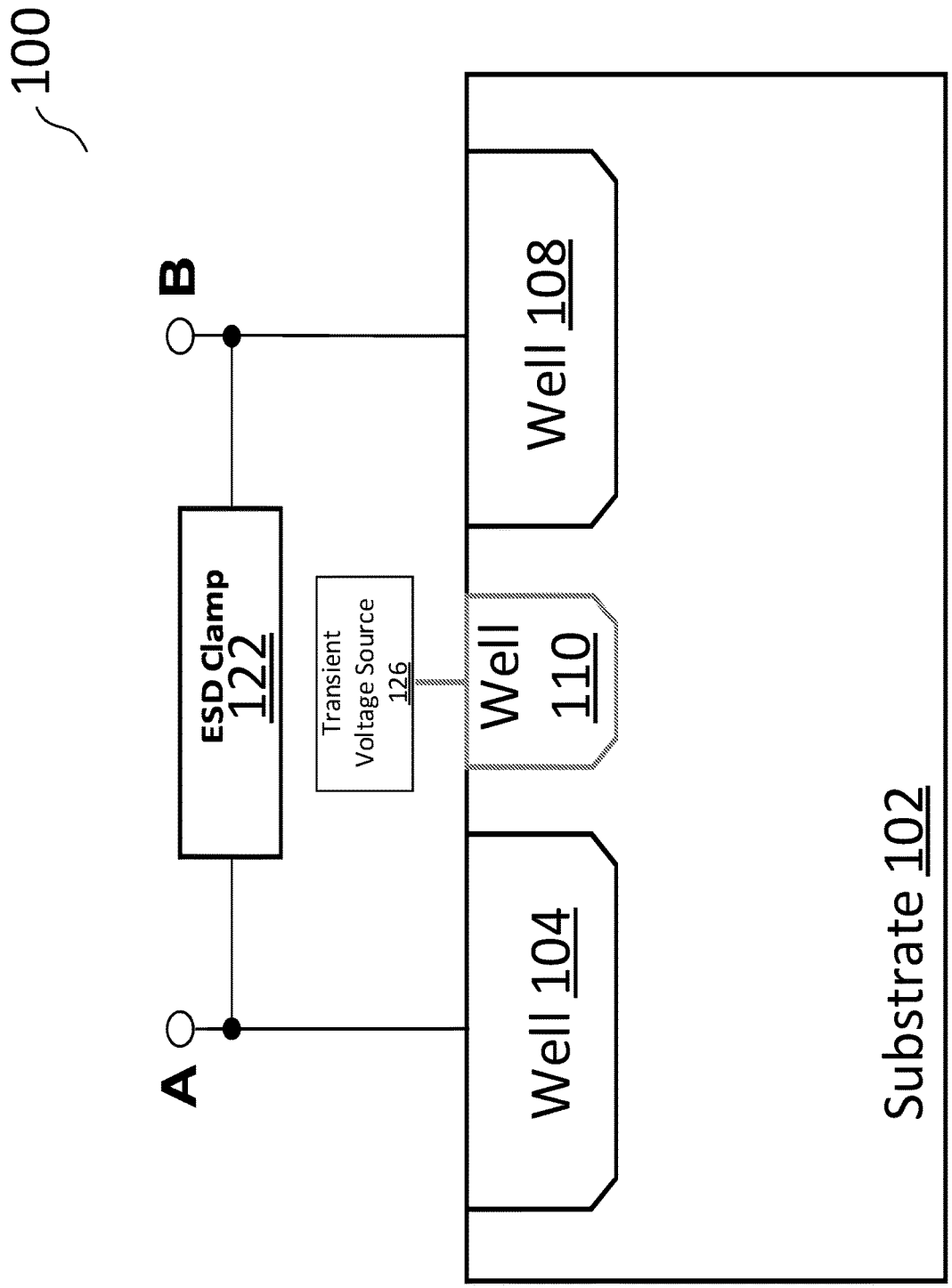
FIG. 1A is a block diagram of an example of an electronic device having electrostatic discharge (ESD) protection.

Referring to FIG. 1A, an example of an electronic device with ESD protection is an electronic device 100. In one example, the electronic device 100 is an integrated circuit. In one example, the electronic device includes BCD (Bipolar-CMOS (complementary metal oxide semiconductor)-DMOS (double diffused metal-oxide-semiconductor)) technology.

The electronic device 100 includes a substrate 102. The substrate includes a well 104, a well 108 and a well 110 between the well 104 and the well 108. The wells 104, 108, 110 are doped opposite the substrate 102. For example, if the substrate 102 has p-type doping, then the wells 104, 108, 110 have n-type doping. In another example, if the substrate 102 has n-type doping, then the wells 104, 108, 110 have p-type doping.

The electronic device 100 further includes an ESD clamp 122 and a transient voltage source 126. The ESD clamp 122 is connected to a terminal A and to a terminal B, where the terminal A is connected to the well 104 and the terminal B is connected to the well 108. The ESD clamp 122 serves as an intended current path during ESD event. For example, during an ESD strike on terminal B(+) with respect to terminal A(−), the ESD clamp 122 turns on to conduct ESD energy from terminal B to A.

The transient voltage source 126 is connected to the well 110. In one example, the transient voltage source 126 is activated during an ESD transient. The transient voltage source 126 provides a voltage during an ESD event that is less than a clamp voltage Vclamp provided by the ESD clamp 122. In one example, the transient voltage source 126 produces a voltage that is equal to Vclamp times n, where n<1. In one example, the transient voltage source 126 may be constructed to tune n in the range between 0.01 to 0.25 to achieve optimal functionality.

In one example, a functionality requirement for the well 110 is to act as an effective collector of carriers injected from the well 104 (emitter). For effective collection (e.g., in a bipolar action) the voltage on the well 110 should be, in one example, at least 1V above the well 104. In one example, the upper limit may be determined by a maximum power dissipation on a collector junction (voltage times current product). In one example, the practical optimal range should be 1 to 5V above the well 104.

Figure 1B:
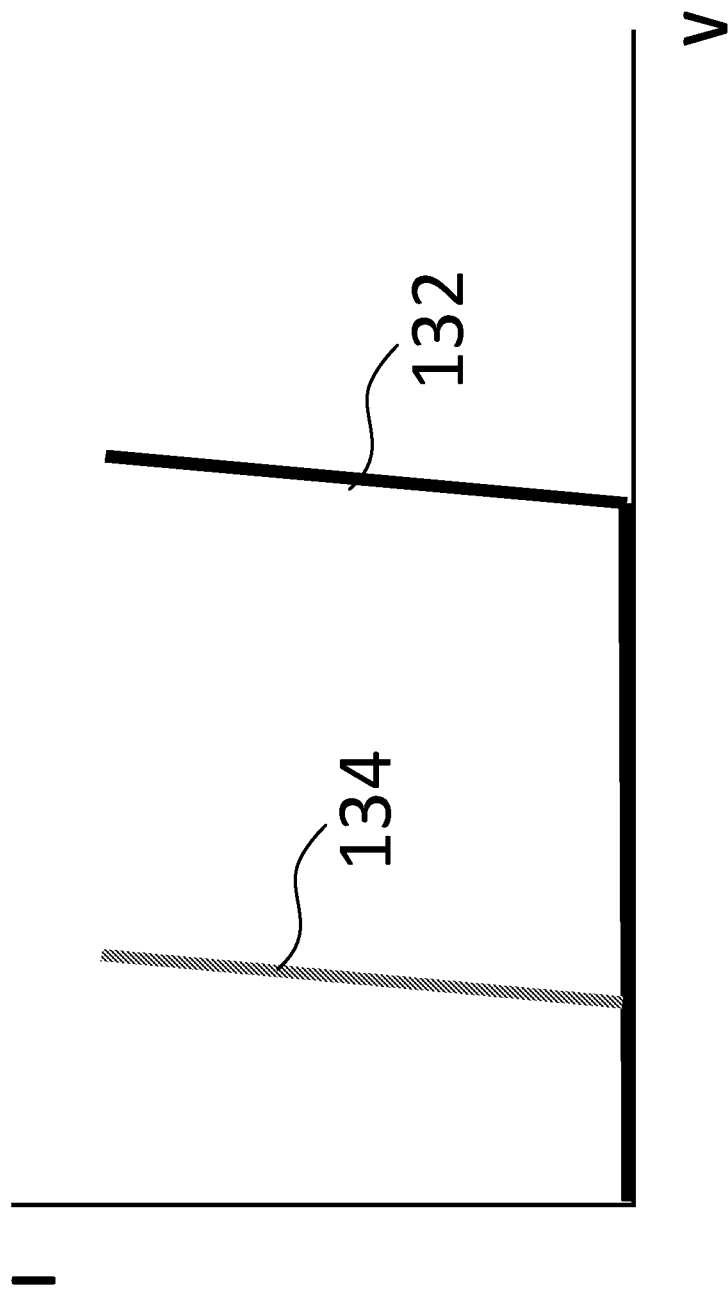
FIG. 1B is a graph of an example of current versus voltage representative of transmission-line pulse (TLP) characteristics for an ESD clamp and a transient voltage source.

FIG. 1B is a graph of current-versus-voltage representative of transmission-line pulse (TLP) characteristics for the ESD clamp 122 and the transient voltage source 126. A curve 132 represents the ESD clamp 122 and a curve 134 represents the transient voltage source 126.

In one example, the electronic device 100 operates over 100 Volts. Such high voltage poses a specific challenge for design of integrated ESD protection.

Without the well 110 and the transient voltage source 126, during an ESD event, a high voltage differential may develop between the two wells 104, 108 causing a turn-on of a parasitic well-substrate-well bipolar transistor (i.e., the well 104-substrate 102-well 108 combination) and a consequential failure of well-substrate (i.e., the well 108-substrate 102) isolation. Moreover, without the well 110 and transient voltage source 126, a high voltage drop in the depletion region between a well 104 or a well 108 (depending on the doping scheme) and the substrate 102 may cause excessive energy release near a collector junction, causing silicon filamentation and permanent structural damage.

However, with the well 110 and the transient voltage source 126, the effects of the parasitic transistor (i.e., the well 104-substrate 102-well 108 combination) are reduced and the potential for failure of the well-substrate (i.e., the well 108-substrate 102) isolation is also reduced by the formation of an another parasitic transistor with the addition of the well 110. These parasitic transistors are turned on during an ESD event.

Figure 1C:
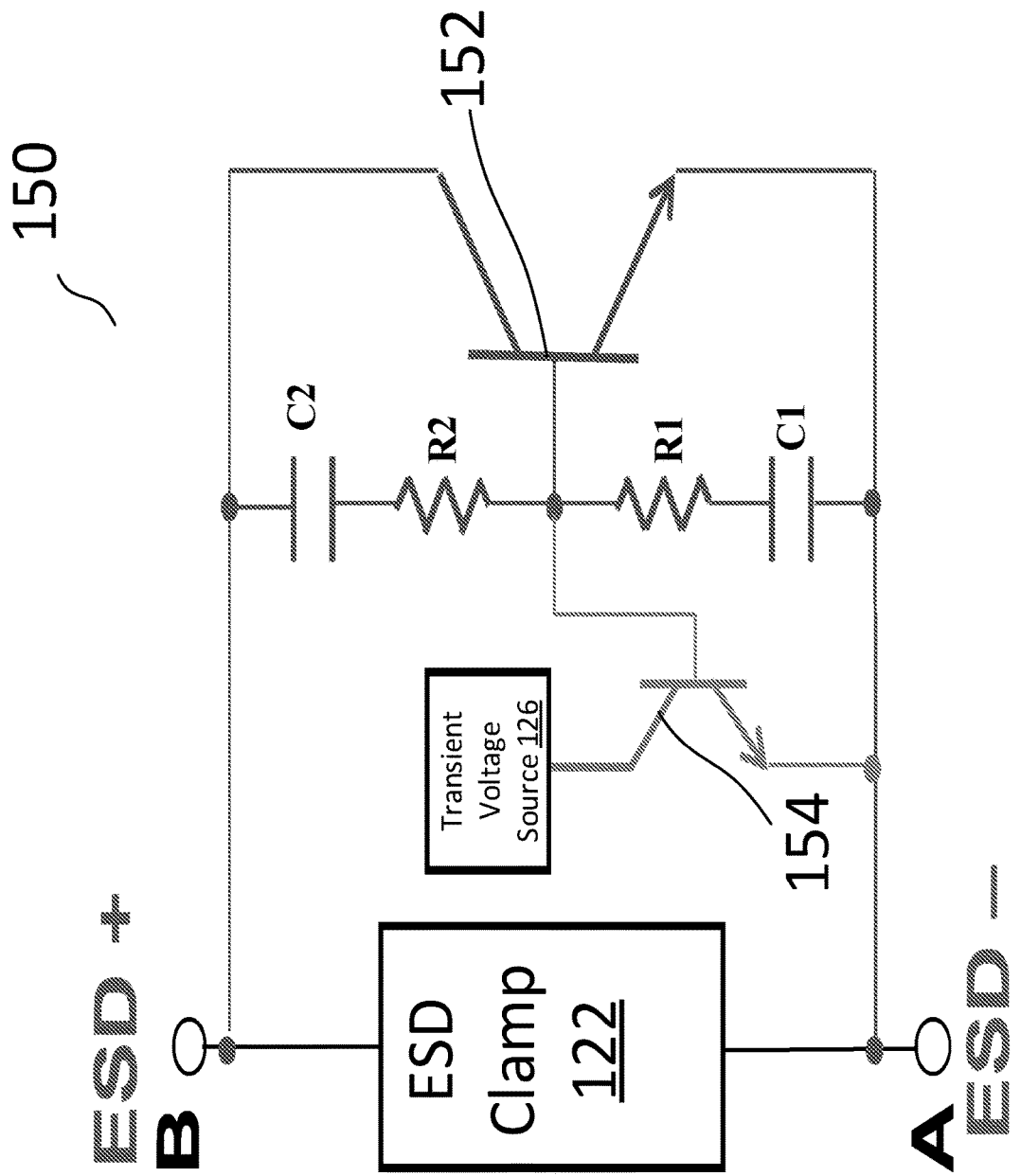
FIG. 1C is a circuit diagram of an example of an equivalent circuit to the electronic device of FIG. 1A for a specific doping example.

Referring to FIG. 1C, a circuit 150 is a circuit equivalent of the electronic device 100 for a specific doping scheme where the substrate 102 is p-typed doped and the wells 104, 108, 110 are n-type doped. The circuit 150 includes a capacitor C1 connected to the terminal A and an emitter of a transistor 152 (e.g., an npn transistor); a resistor R1 connected to the capacitor C1 and a base of the transistor 152; a resistor R2 connected to the resistor R1 and the base of the transistor 152; and a capacitor C2 connected to the resistor R2, the terminal B and a collector of the transistor 152.

The capacitor C1 is formed at a junction between the substrate 102 and the well 104, and the capacitor C2 is formed at a junction between the substrate 102 and the well 108. The resistors R1 and R2 are formed within the substrate 102 (FIG. 1A).

The transistor 152 is formed from the well 104-the substrate 102-the well 108 combination (FIG. 1A). The collector of the transistor 152 is formed at the junction of the well 108 and the substrate 102; the emitter of the transistor 152 is formed at the junction of the well 104 and the substrate 102; and the base of the transistor is formed by the substrate 102.

The circuit 150 also includes a transistor 154 (e.g., an npn transistor) having a collector connected to the transient voltage source 126; a base connected to the base of the transistor 152; and an emitter connected to the terminal A and the emitter of the transistor 152. The transistor 154 is formed from the well 104-the substrate 102-the well 110 combination (FIG. 1A). The collector of the transistor 154 is formed at the junction of the well 110 and the substrate 102; the emitter of the transistor 154 is formed at the junction of the well 104 and the substrate 102; and the base of the transistor 154 is formed by the substrate 102.

Without the well 110 and transient voltage source 126, during an ESD event, a high voltage transient Vclamp forms between terminals B and A and may cause a turn-on of the parasitic transistor 152 as follows: (1) a high voltage spike on terminal B is coupled to the well 108, which capacitively couples to the substrate 102 through capacitor C2 and propagates further through the substrate 102 via resistors R2, R1 and capacitor C1 to the well 104, coupled to terminal A; (2) a transient current may result in a turn-on of a parasitic transistor 152, causing injection of electrons from well 104 into the substrate 102 and collection of those electrons by the well 108; and (3) a high voltage drop in the depletion region between the well 108 and the substrate 102 may cause excessive energy release near the collector junction (i.e., substrate 102/well 108 junction), causing silicon filamentation and permanent structural damage.

In one example, with the well 110 and transient voltage source 126, during an ESD event, the transistor 152 exhibits parasitic turn-on; however, the presence of the well 110 modulates the conduction path as follows: (1) electrons injected from the well 104 into the substrate 102 are collected by the immediately adjacent well 110, instead of the well 108, and thus, the collection of electrons are managed by the parasitic transistor 154 rather than the transistor 152, and (2) because the well 110 is biased at a potential of Vclamp times n, which is 1/n times smaller than Vclamp, the power dissipation in a collector of the transistor 154 (i.e., substrate 102/well 110 junction) may be proportionally 1/n times smaller than in the case of the transistor 152. Consequently, the techniques described prevents overheating, silicon filamentation and associated failure.

In one example, the well 110 collects a majority of injected electrons, but not all. Some electrons may still reach the well 108 (collector). However, the current into the well 108 may be greatly reduced compared to not having the well 110 at all.

In one example, the transient voltage source 126 may be located on the electronic device 100. In another example, the transient voltage source may be located external to the electronic device 100.

Figure 2A:
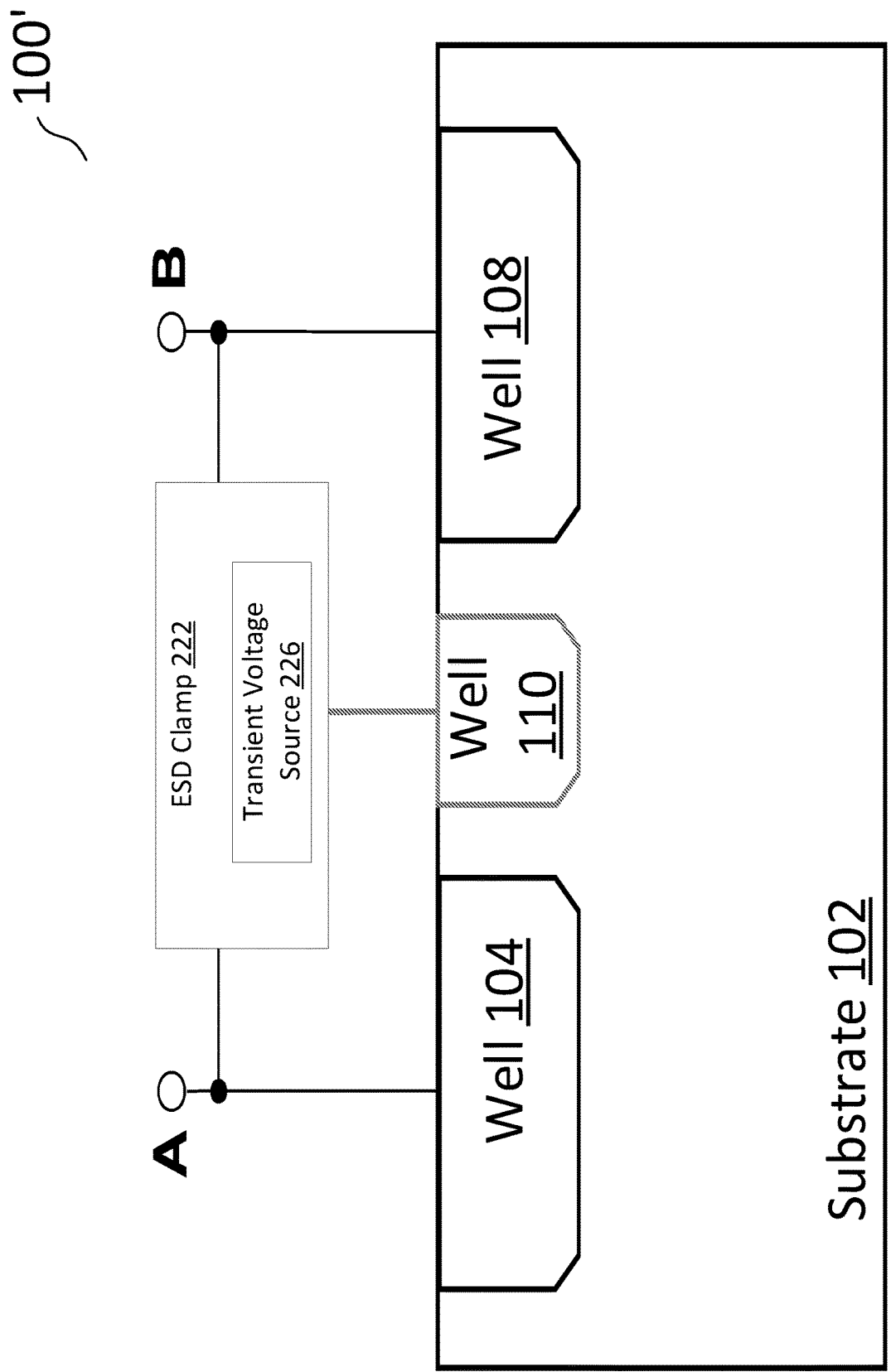
FIG. 2A is a block diagram of another example of an electronic device of FIG. 1A.
Figure 2B:
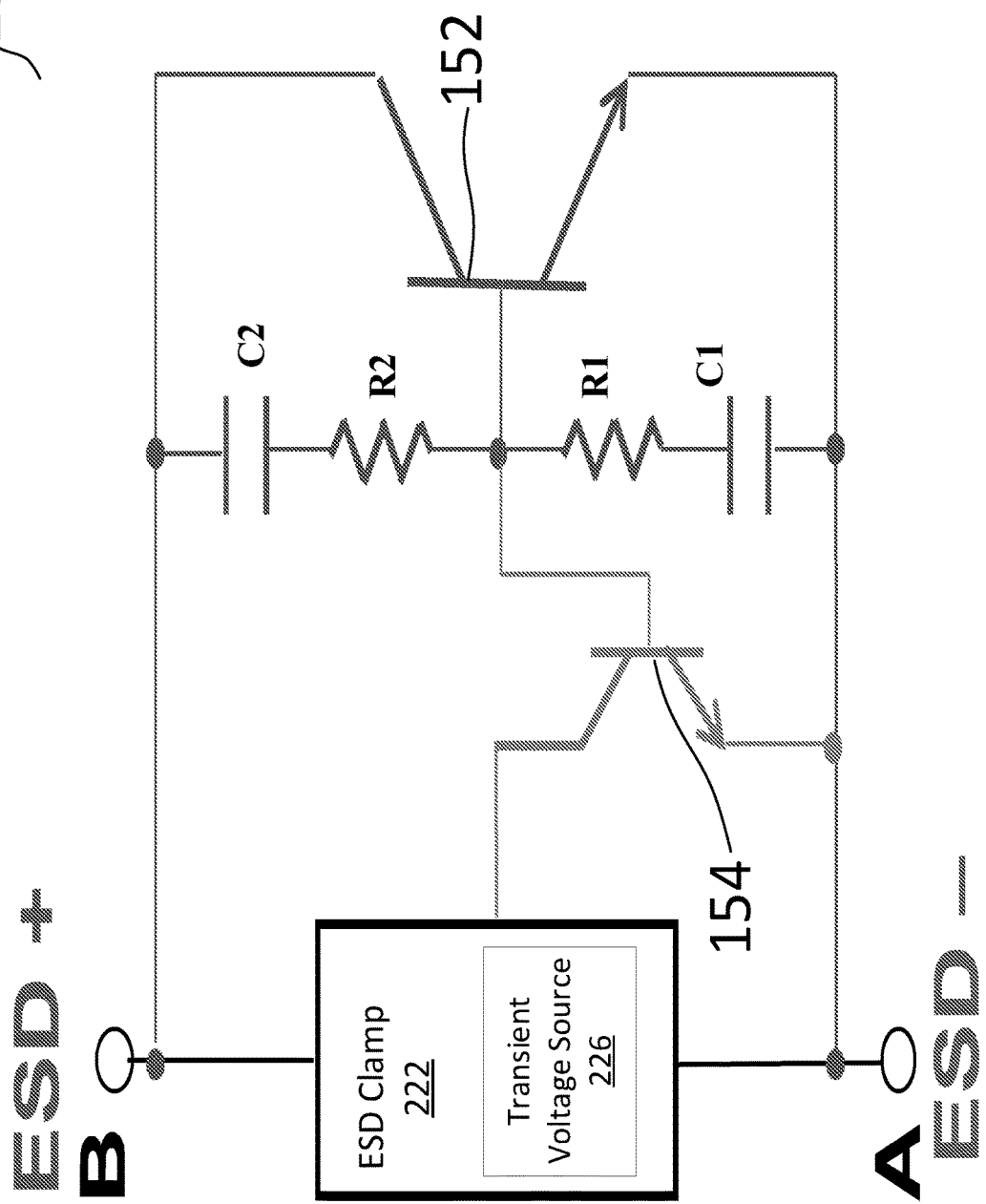
FIG. 2B is a circuit diagram of an example of an equivalent circuit to the electronic device of FIG. 2A for a specific doping example.

Referring to FIG. 2A, in another example, a transient voltage source may be located with an ESD clamp. For example, an electronic device 100' is similar to the electronic device 100 except a transient voltage source 226 is located with an ESD clamp 222. Referring to FIG. 2B, a circuit 250 is a circuit equivalent of the electronic device 100' for a specific doping scheme where the substrate 102 is p-typed doped and the wells 104, 108, 110 are n-type doped.

Figure 3A:
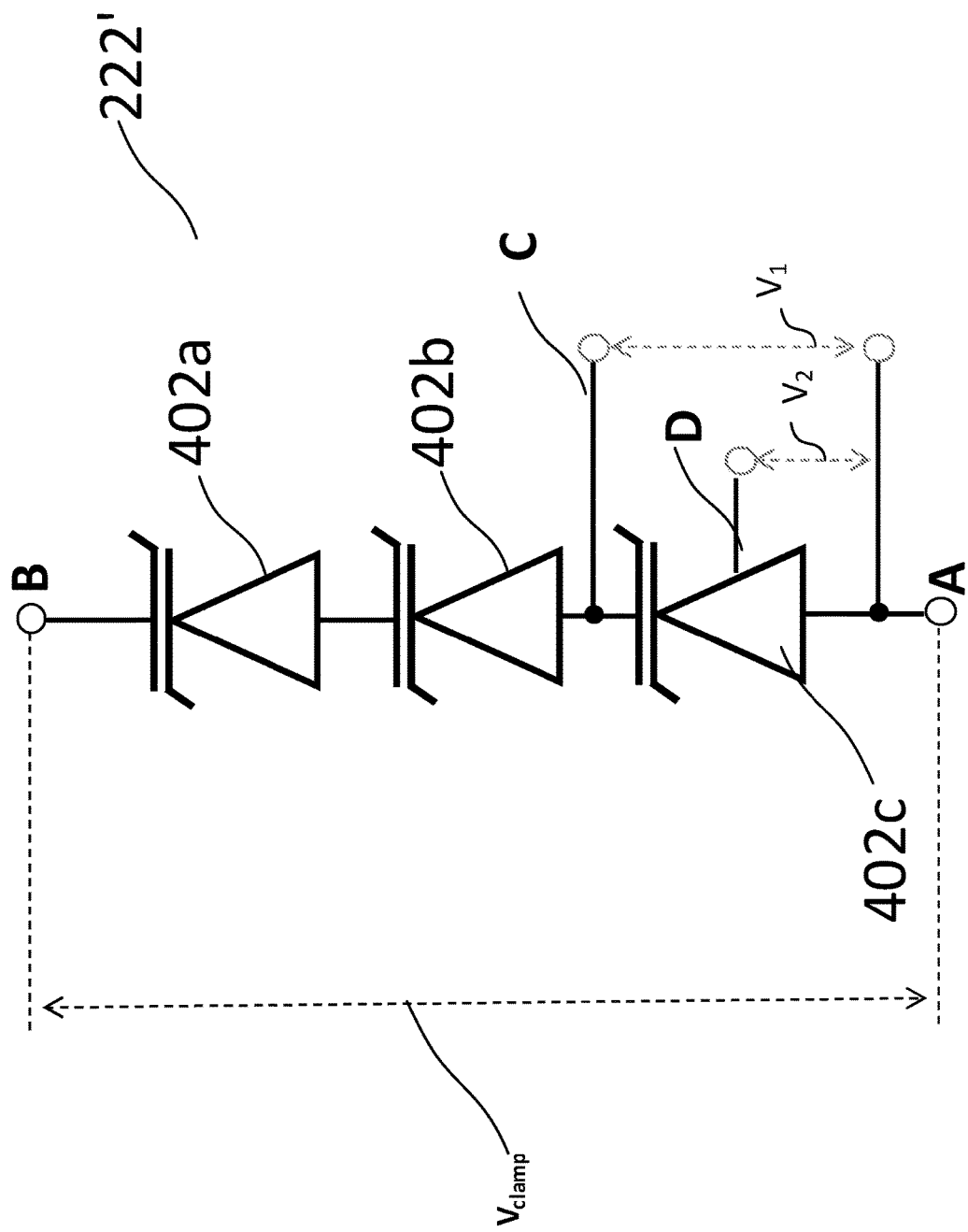
FIG. 3A is a circuit diagram of an example of an ESD clamp of FIG. 2A.
Figure 3B:
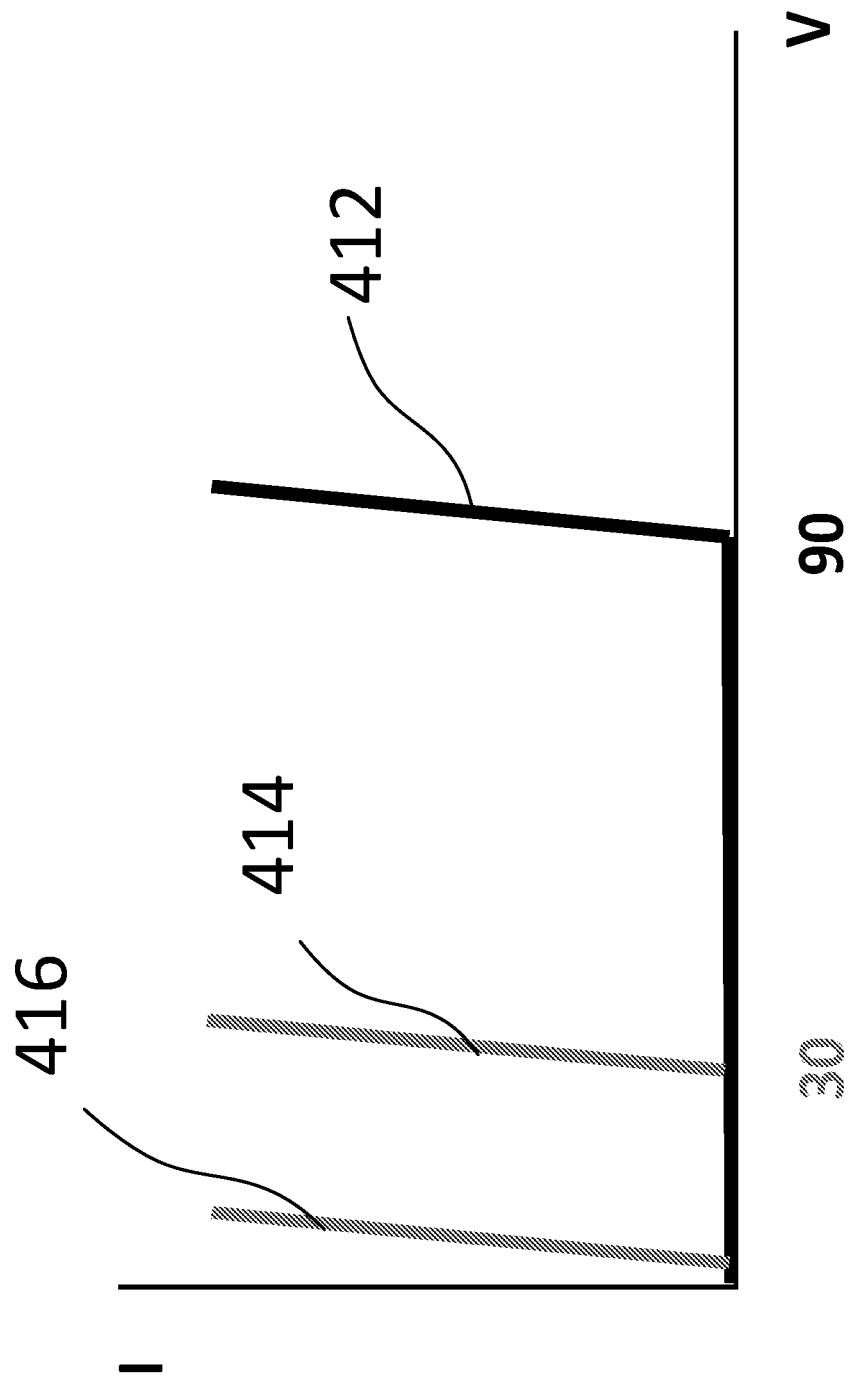
FIG. 3B is a graph of an example of current versus voltage representative of transmission-line pulse (TLP) characteristics for an ESD clamp and a transient voltage source.

Referring to FIGS. 3A and 3B, one example of the ESD clamp 222 (FIG. 2A) is an ESD clamp 222'. The ESD clamp 222' includes stacked Zener diodes (e.g., a Zener diode 402a, a Zener diode 402b and a Zener diode 402c). In one example, each Zener diode 402a-402c is a Zener-triggered Darlington clamp.

In one example, a transient voltage source 226 (FIG. 2A) may be connected to a terminal C, which is located between Zener diodes 402b and 402c, and connected to the terminal A; and provides a voltage $V_1$. In another example, the transient voltage source 226 (FIG. 2A) may be connected to a terminal D, which is at a base terminal of the npn transistor within a Zener-triggered Darlington clamp, and to the terminal A and provides a voltage $V_2$.

In one particular example, the Zener-triggered Darlington clamps 402a-402c (FIG. 3A) are 30V clamps, V1 is equal to Vclamp*.33 or 30V and V2 is equal to Vclamp*.015 or 1.4V. In this example, a curve 412 represents the ESD clamp 222', a curve 414 represents the transient voltage source 226 connected to the terminals C and A, and a curve 416 represents the transient voltage source 226 connected to the terminals D and A (FIG. 3B).

While FIG. 3A depicts using Zener diodes or Zener-triggered Darlington clamps in an ESD clamp in a serial connection (i.e., the Zener diodes or Zener-triggered Darlington clamps connected in series) to provide a transient voltage source, other alternatives to providing a transient voltage source may include active and passive circuitry to achieve a desired voltage level for the transient voltage source. In one example, grounded-gate n-type MOSFETs (metal-oxide-semiconductor field-effect transistors) may be used in a serial connection to provide a transient voltage source. In another example, silicon-controlled rectifiers (SCRs) (sometimes referred to as a thyristor) may be used in a serial connection to provide a transient voltage source. In a further example, any combination of Zener diode, grounded-gate n-type MOSFET and SCR may be used in a serial connection to provide a transient voltage source.

Figure 4A:
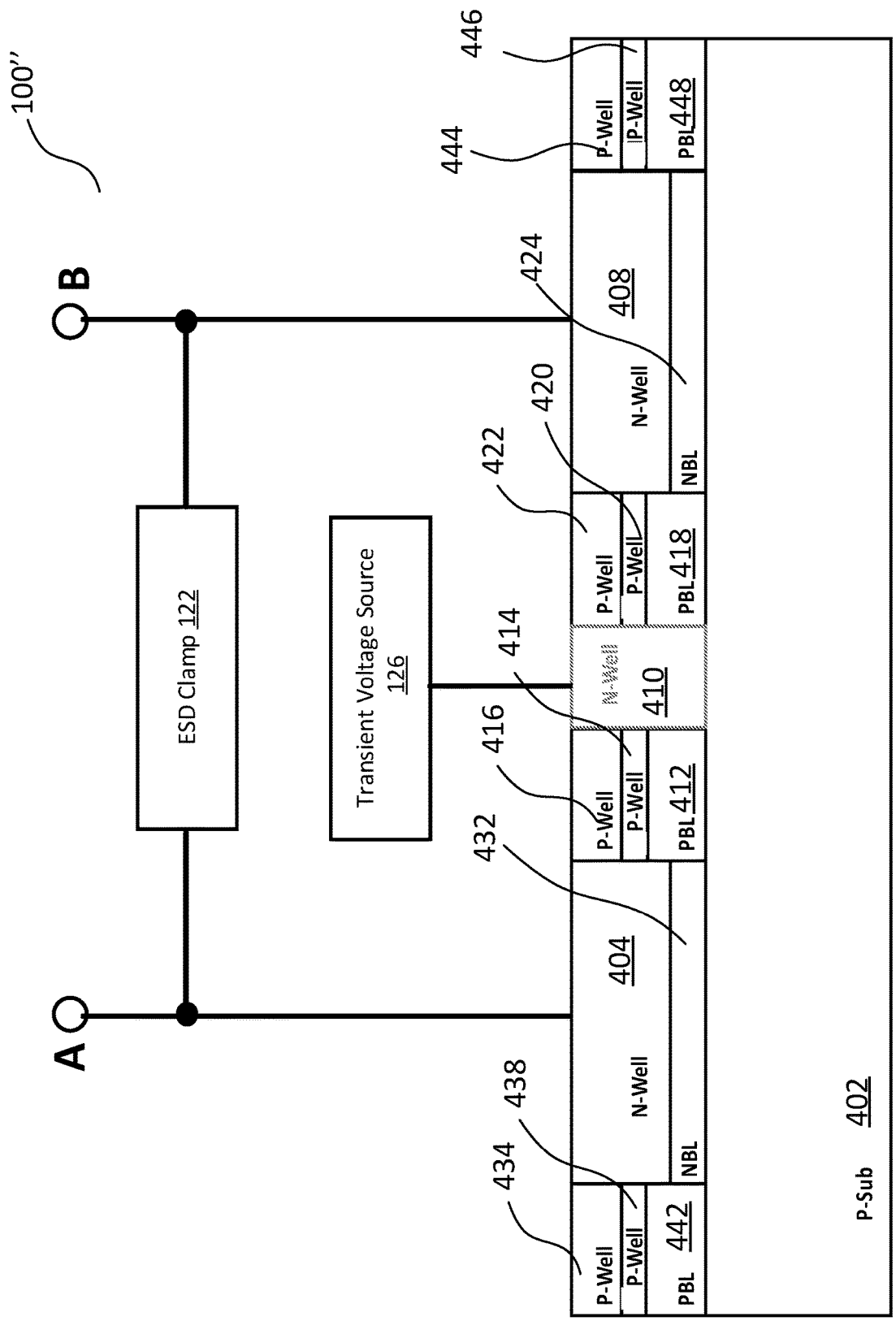
FIG. 4A is a diagram of a further example of the electronic device of FIG. 1A for a specific doping scheme.

Referring to FIG. 4A, another example of the electronic device 100 is an electronic device 100" for a specific doping scheme. The electronic device 100" includes a substrate 402, a well 404, a well 408 and a well 410. The substrate 402 is p-typed doped and the wells 404, 408, 410 are n-type doped. The well 404 is connected to the terminal A, the well 408 is connected to the terminal B, and the well 410 is connected to the transient voltage source 126.

An n-type buried layer (NBL) 432 separates the well 404 from the substrate 402, and an n-type buried layer (NBL) 424 separates the well 408 from the substrate 402.

The well 404 and the buried layer 432 separate a p-type well 434, a p-type well 438 and a p-type buried layer (PBL) 442 from a p-type well 416, a p-type well 414 and a p-type buried layer (PBL) 412. The well 408 and the buried layer 424 separate a p-type well 422, a p-type well 420 and a p-type buried layer (PBL) 418 from a p-type well 444, a p-type well 446 and a p-type buried layer (PBL) 448. The well 410 separates the well 416, the well 414 and the buried layer 412 from the well 422, the well 420 and the buried layer 418.

In one example, the well 414 is used to provide a robust and contiguous p-type region from surface to substrate. The well 414 works in conjunction with the wells 416, 412. The well 414 may also serve other specific functions in construction of devices.

In one example, the well 404 may be formed by an epitaxial process and is relatively thick at 8.5 µm. In one example, the wells 416, 414 and 412 may be formed by diffusion; and the NBL 432 and the PBL 412 may be formed before N-well epitaxial growth and the wells 414 and 416 are formed after the N-well epitaxial growth. In one example, in order to achieve optimal vertical doping profile across full depth, the well 414 is formed by high energy implantation (>1 MeV).

Figure 4B:
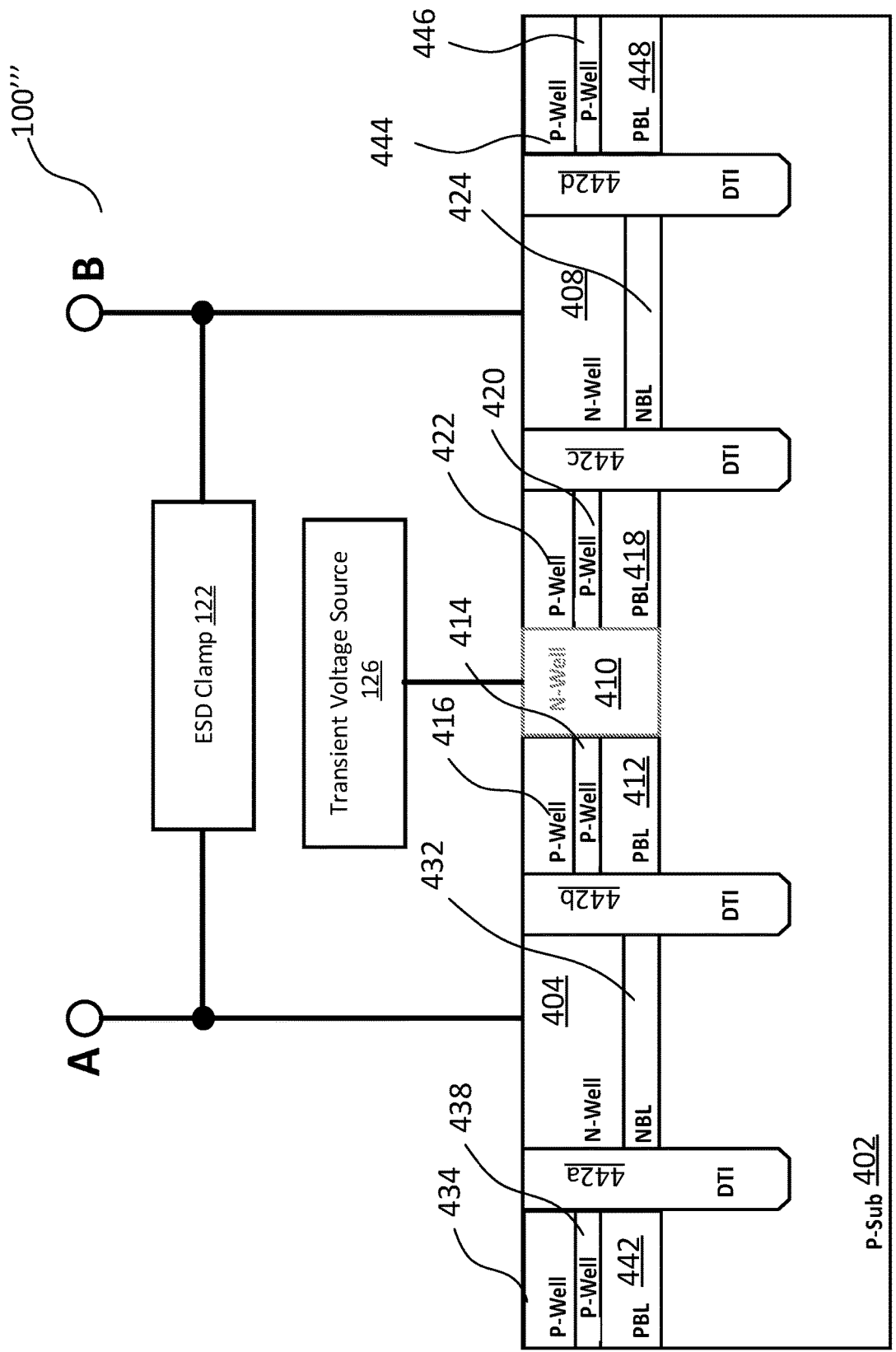
FIG. 4B is a diagram of another example of the electronic device of FIG. 4A.

Referring to FIG. 4B, another example of the electronic device 100" is an electronic device 100'''. The electronic device 100''' is similar to the electronic device 100" except the electronic device 100''' includes deep trench isolation (DTI) barriers. For example, the well 404 and the buried layer 432 includes a DTI barrier 442a on one side and a DTI barrier 442b on a second side opposite the first side, and the well 408 includes a DTI barrier 442c on one side and a DTI barrier 442d on a second side opposite the first side. In one example, each of the DTI barriers 442a-442d extend into the substrate 402 so that a portion of each of the DTI barriers 422a-422d are surrounded by only the substrate 402.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An electronic device comprising:
a substrate having one of a p-type doping or an n-type doping;
a first well in the substrate;
a second well in the substrate;
a third well in the substrate between the first well and the second well, wherein the first, second and third wells are separated from each other, wherein a doping type of the first, second and third wells is the other one of the p-type or n-type doping;
a first terminal connected to the first well;
a second terminal connected to the second well;
an electrostatic discharge (ESD) clamp connected to the first and second terminals, wherein the ESD clamp is configured to clamp the first well and the second well at a clamp voltage during an ESD event; and
a transient voltage source connected to the third well, wherein the transient voltage source is configured to provide a voltage during the ESD event that is less than the clamp voltage.

2. The electronic device of claim 1, further comprising:
complementary metal oxide semiconductor (CMOS) logic; and
a double diffused metal-oxide-semiconductor (DDMOS) transistor.

3. The electronic device of claim 1, wherein the electronic device operates at least at 100 Volts.

4. The electronic device of claim 1, wherein the ESD clamp comprises the transient voltage source.

5. The electronic device of claim 1, wherein the first and the third wells are separated from each other by the substrate, and
wherein the second and third wells are separated from each other by the substrate.

6. The electronic device of claim 1, further comprising:
a first plurality of layers having the same type doping as the substrate and located between the first and the third wells; and
a second plurality of layers having the same type doping as the substrate and located between the second and the third wells.

7. The electronic device of claim 6, further comprising:
a first deep trench isolation (DTI) barrier located between the first and the third wells; and
a second DTI barrier located between the second and the third wells.

8. The electronic device of claim 7, wherein the third well is in direct contact with the substrate.

9. The electronic device of claim 6, wherein the first DTI barrier is in direct contact with the first well, and
wherein the second DTI barrier is in direct contact with the second well.

10. The electronic device of claim 9, further comprising:
a third DTI barrier in direct contact with the first well; and
a fourth DTI barrier in direct contact with the second well.

11. The electronic device of claim 10, wherein at least one of the first well and the second well is separated from the substrate by a buried layer.

12. The electronic device of claim 1, wherein the ESD clamp comprises at least one of a Zener diode, a grounded-gate n-type MOSFET (metal-oxide-semiconductor field-effect transistors) or a silicon-controlled rectifier.

13. The electronic device of claim 12, wherein the ESD clamp comprises a plurality of Zener diodes in series, and
wherein the Zener diodes form Zener-triggered Darlington clamps.

14. The electronic device of claim 13, wherein the transient voltage source is generated from a voltage across at least one of the Zener diodes.

15. The electronic device of claim 13, wherein the transient voltage source is generated from a voltage difference from a terminal of one of the Zener diodes and one of the first or second terminal.

16. The electronic device of claim 1, wherein the first well, the second well and the substrate form a first transistor,
wherein the first well, the third well and the substrate form a second transistor, and
wherein the substrate is a base of the first transistor and is a base of the second transistor,
wherein the first transistor and the second transistor turn on during the ESD event.

17. The electronic device of claim 16, wherein the substrate has p-type doping and the first, second and third wells have n-type doping.

18. The electronic device of claim 17, wherein the first well is an emitter of the first transistor and an emitter of the second transistor.

19. The electronic device of claim 18, wherein the second well is a collector of the first transistor and the third well is a collector of the second transistor.

20. The electronic device of claim 1, wherein the first well, the substrate and the second well are configured to form a first transistor wherein a junction between the substrate and the second well form a collector of the first transistor,
wherein the first well, the substrate and the third well are configured to form a second transistor wherein a junction between the substrate and the third well form a collector of the second transistor,
wherein the first and second transistor are configured to turn on during the ESD event.

* * * * *

UNITED STATES PATENT AND TRADEMARK OFFICE
CERTIFICATE OF CORRECTION

PATENT NO. : 11,195,826 B2
APPLICATION NO. : 16/776680
DATED : December 7, 2021
INVENTOR(S) : Maxim Klebanov et al.

It is certified that error appears in the above-identified patent and that said Letters Patent is hereby corrected as shown below:

In the Specification

Column 1, Line 13 delete "event (ESD) event." and replace with --(ESD) event.--.

Column 2, Line 37 delete "during ESD" and replace with --during an ESD--.

Column 3, Line 23 delete "p-typed" and replace with --p-type--.

Column 4, Line 34 delete "p-typed" and replace with --p-type--.

Column 5, Line 11 delete "p-typed" and replace with --p-type--.

Column 5, Line 43 delete "100" is an electronic device 100"." and replace with --100" is an electronic device 100'".--.

Signed and Sealed this
Fourteenth Day of February, 2023

Katherine Kelly Vidal
*Director of the United States Patent and Trademark Office*